United States Patent [19]
Teng et al.

[11] Patent Number: 4,987,093
[45] Date of Patent: Jan. 22, 1991

[54] THROUGH-FIELD IMPLANT ISOLATED DEVICES AND METHOD

[75] Inventors: Clarence W. Teng, Plano; Roger A. Haken, Dallas, both of Tex.

[73] Assignee: Texas Instruments Incorporated, Dallas, Tex.

[21] Appl. No.: 426,824

[22] Filed: Oct. 24, 1989

Related U.S. Application Data

[62] Division of Ser. No. 38,388, Apr. 15, 1987, Pat. No. 4,890,147.

[51] Int. Cl.⁵ .................... H01L 21/265; H01L 21/76
[52] U.S. Cl. .............................. 437/69; 437/28; 437/70
[58] Field of Search .................. 437/69, 70, 28

[56] References Cited

U.S. PATENT DOCUMENTS

| | | | |
|---|---|---|---|
| 3,860,454 | 1/1975 | De Witt et al. | 437/40 |
| 4,261,761 | 4/1981 | Sato et al. | 437/69 |

FOREIGN PATENT DOCUMENTS

| | | | |
|---|---|---|---|
| 55-27462 | 7/1980 | Japan | 437/70 |
| 56-87359 | 7/1981 | Japan | 437/70 |
| 56-93341 | 7/1981 | Japan | 437/70 |

OTHER PUBLICATIONS

Tsai et al., IEEE Electron Device Letters, vol. 10, No. 7 (Jul. 1989), pp. 307–309.

*Primary Examiner*—Olik Chaudhuri
*Assistant Examiner*—George R. Fourson
*Attorney, Agent, or Firm*—Richard A. Stoltz; James T. Comfort; Melvin Sharp

[57] ABSTRACT

Preferred embodiments include channel stop implants for CMOS devices by through field boron implants (152) after the field oxide (144, 145) has been grown and with the implant depth determined by the thin portions of the field oxide (145). Junction (154) breakdown is preserved by channeling the implant (152) to penetrate far below the junctions (154).

3 Claims, 6 Drawing Sheets

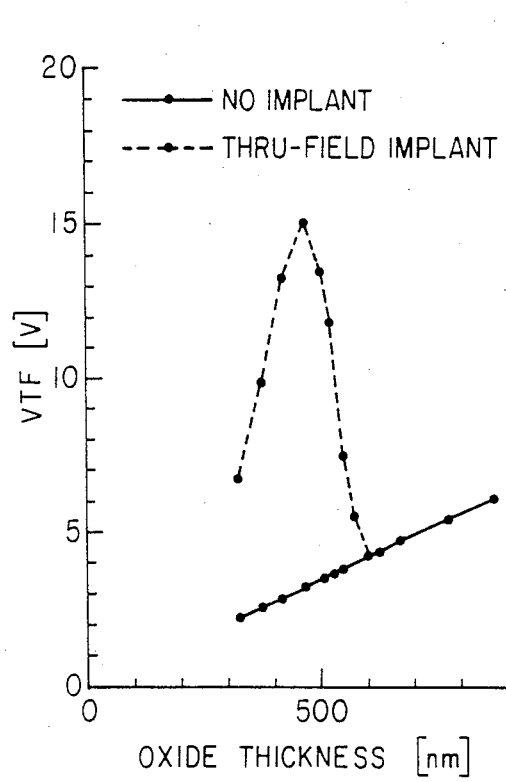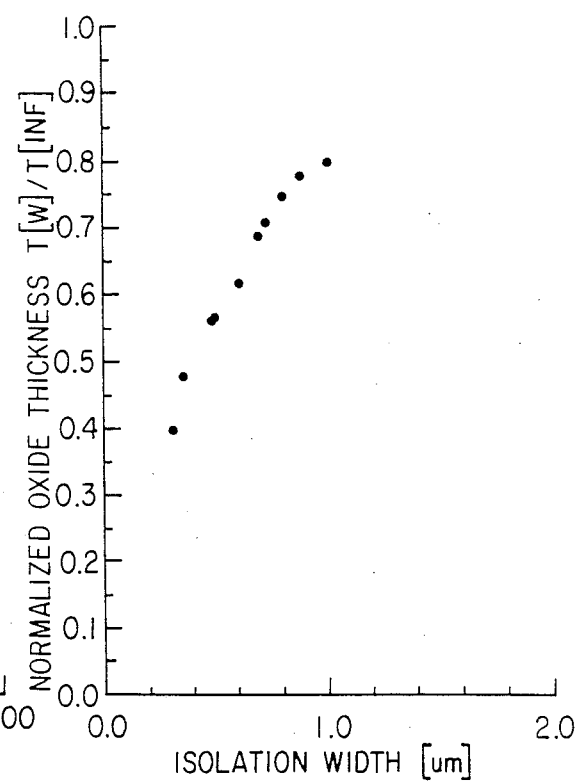
FIG. 3A
FIG. 3B

THROUGH-FIELD IMPLANT ISOLATED DEVICES AND METHOD

This is a division, of application Ser. No. 07/038,388, filed Apr. 15, 1987 now U.S. Pat. No. 4,890,147.

BACKGROUND OF THE INVENTION

1. Field of the Invention

The present invention relates to semiconductor integrated circuits and methods of fabrication, and, in particular, to electrical isolation of devices in integrated circuits.

2. Description of the Related Art

The electrical isolation of active devices in silicon integrated circuit technology includes both general silicon oxide isolation in the "field" regions between devices and special application isolation structures. The most common isolation is the field region, which is typically implemented by partially or fully recessed thick oxide regions between active device regions (moats). Complete oxide isolation with no parasitic leakage paths is possible only in silicon-on-insulator (SOI) technologies. Special isolation structures, such as deep trenches, have been developed to separate the n and p well regions of complementary MOS (CMOS).

Almost all modern integrated circuits use LOCOS (local oxidation of silicon) for device isolation. A nitride/oxide stack is formed on the silicon substrate and is photolithographically patterned and etched to remove the nitride layer in the field regions. Oxidation then follows and the silicon is oxidized only locally in the field regions without nitride coverage. For PMOS the substrate is typically doped n type with phosphorus, and during oxidation the phosphorus segregates into the silicon so the oxide/silicon interface becomes heavily doped. In contrast, for NMOS the substrate is typically doped p type with boron, and during oxidation the boron segregates into the oxide and the oxide/silicon interface is depleted of dopants. The low interface doping for NMOS implies low threshold voltages for parasitic transistors and a need for "channel stop" doping at the interface to raise the parasitic threshold voltages. Consequently, before the resist is stripped off, additional boron impurities to form channel stops are implanted into the field regions. The thickness of the field oxide typically is between 0.7 and 1.0 μm. Note that even for CMOS fabrication where adequate isolation structures are necessary between both n+ and p+ junctions, normally no additional lithographic step is needed for the channel-stop implant.

LOCOS advantageously allows introduction of the channel-stop impurities self-aligned to the field region, and it provides a smooth field oxide topography favorable for device fabrication. A major drawback of LOCOS is the so-called "bird's beak" transition between the field region and the moats which is caused by the lateral diffusion of oxidizing species beneath the nitride oxidation mask. The transition length varies depending on the oxidation condition, but is usually 0.3 μm or more. This transition reduces the device packing density and, as the isolation area is scaled down for VLSI application, the problem becomes more serious.

Scaling down the field oxide thickness can reduce the bird's beak encroachment, but requires a heavier channel-stop implantation to maintain adequate isolation between the devices. The lateral diffusion of the channel-stop impurities during the field oxidation and subsequent high temperature processes can degrade junction capacitance, increase the junction leakage and reduce the "effective" electrical channel width associated with MOS current gain.

An option in scaling LOCOS is channel-stop implantation after the field oxidation; that is, implant channel-stop boron through the field oxide. This avoids the segregation of boron into the field oxide during the field oxidation, and retains more boron impurities near the oxide/silicon interface in silicon. As a result, thinner oxide can be used to achieve appropriate isolation; however, the threshold voltage for parasitic moat-to-moat transistors (with the field oxide acting as the transistor's gate oxide) is very sensitive to the oxide thickness. This is one of the problems associated with the through-field implant technique since the variation of field oxide thickness can be significant because for any local oxidation process the oxidation rate is a function of the width of the oxidizing space. If the space is less than 2 μm wide, then the rate significantly reduces as the width is decreased. At 0.5 μm wide space, the oxide thickness can be 30% less than bulk value. The reduction may be due to the overlap of the nitride stress from either edge of the pattern. The through-field implant for such thinner oxide regions will then penetrate the silicon substrate and have little impact on the doping level at the oxide/silicon interface and little channel stop effect.

Another problem associated with through-field implant is the increased junction capacitance and reduced junction breakdown voltage for n+/p junctions. This is due to the increased substrate p dopant concentration under the junctions from the high energy, unmasked through-field implant. In principle a masked implant is possible to implant only the field regions in p type substrate. However, it's unpractical because patterning the field already is close to the lithographic limit, yet the implant mask requires patterning a geometry which is even smaller than the field to accommodate the alignment tolerance. With blanket implant without any mask (or a non-critical p well mask for CMOS), boron impurities are also implanted into the moat regions. The peak concentration may be on the order of $1 \times 10^{17}/cm^3$ and the depth about the oxide thickness. As a result, the n+/p junction capacitance as well as reversed junction leakage is increased. As the field oxide thickness is scaled down, the impurity profile is closer to the junction and the problem becomes more severe.

Modifications of the LOCOS process have been investigated. SILO, or Sealed-Interface Local Oxidation, uses an additional nitride layer, formed by plasma-enhanced nitridation, approximately 10 nm in thickness, to reduce the bird's beak; see J. Hui et al, 29 IEEE Tr.Elec.Dev. 554 (1982). Another approach uses a poly buffer layer between the nitride and the initial oxide; see R. Havemann et al, U.S. Pat. No. 4,541,167.

Several additional techniques have been investigated for reducing the amount of oxide encroachment, as replacements for standard LOCOS. Those that are sufficiently planar can be divided into three categories: (1) modified LOCOS that use improved nitridation masking, such as SWAMI, or MF3R, (2) recessed silicon regions (low to medium aspect "trenches") refilled by CVD oxide, such as BOX isolation, and (3) selective epitaxial growth (SEG). Non-planar techniques, such as direct moat isolation have been studied, but are not favored because of the patterning difficulties associated with subsequent levels such as interconnect.

In addition to improving subsequent patterning, such as avoiding filaments after anisotropic etching of gate interconnect, planarity is desirable because the recessed oxide structure is more effective in reducing the channel narrowing effect; see H. Iwai et al, 29 IEEE Tr.Elec.-Dev. 625 (1982). Also, it is electrically superior in isolation. arising from an enhanced potential barrier at each bottom corner of the recessed oxide region; see S. Goodwin et al, 31 IEEE Tr.Elec.Dev. 861 (1984). Without sufficient recess, barriers do not exist because the diffused junctions overwhelm the two corners. As the isolation width is reduced, these enhanced barriers may dominate the isolation characteristics.

Unlike local oxidation process, BOX uses a deposited oxide. Thermal oxidation depletes the channel stop boron impurities near the interface which degrades the isolation. Using deposited oxide can retain more boron under the field and can achieve sharper corners with more potential barrier enhancement. However, the poorer oxide quality, even after densification or slight reoxidation, can produce a parasitic current path along the field oxide.

All of these modifications of and substitutes for LOCOS involve more complicated processing than standard LOCOS, and it is a problem to provide simple and efficient isolation in LOCOS as feature sizes scale down below 1 μm.

SUMMARY OF THE INVENTION

The present invention provides channel stop impurity implantation after field oxidation for isolation in silicon integrated circuits; the implantation is performed without active area (moat) masking and with ion energy to just penetrate to the interface of oxide/silicon at small width field oxide regions. The ion beam alignment enhances channeling of the implants in active area regions.

This solves the problems of channel-stop impurity segregation during field oxidation, active area masking with below 1 μm geometries for through-field implantation of channel-stop impurities, and complexities of alternative isolation methods such as SWAMI.

BRIEF DESCRIPTION OF THE DRAWINGS

The drawings are schematic for clarity.

FIGS. 3A–B show field threshold voltage and field oxide thickness;

DESCRIPTION OF THE PREFERRED EMBODIMENTS

Figure 1:
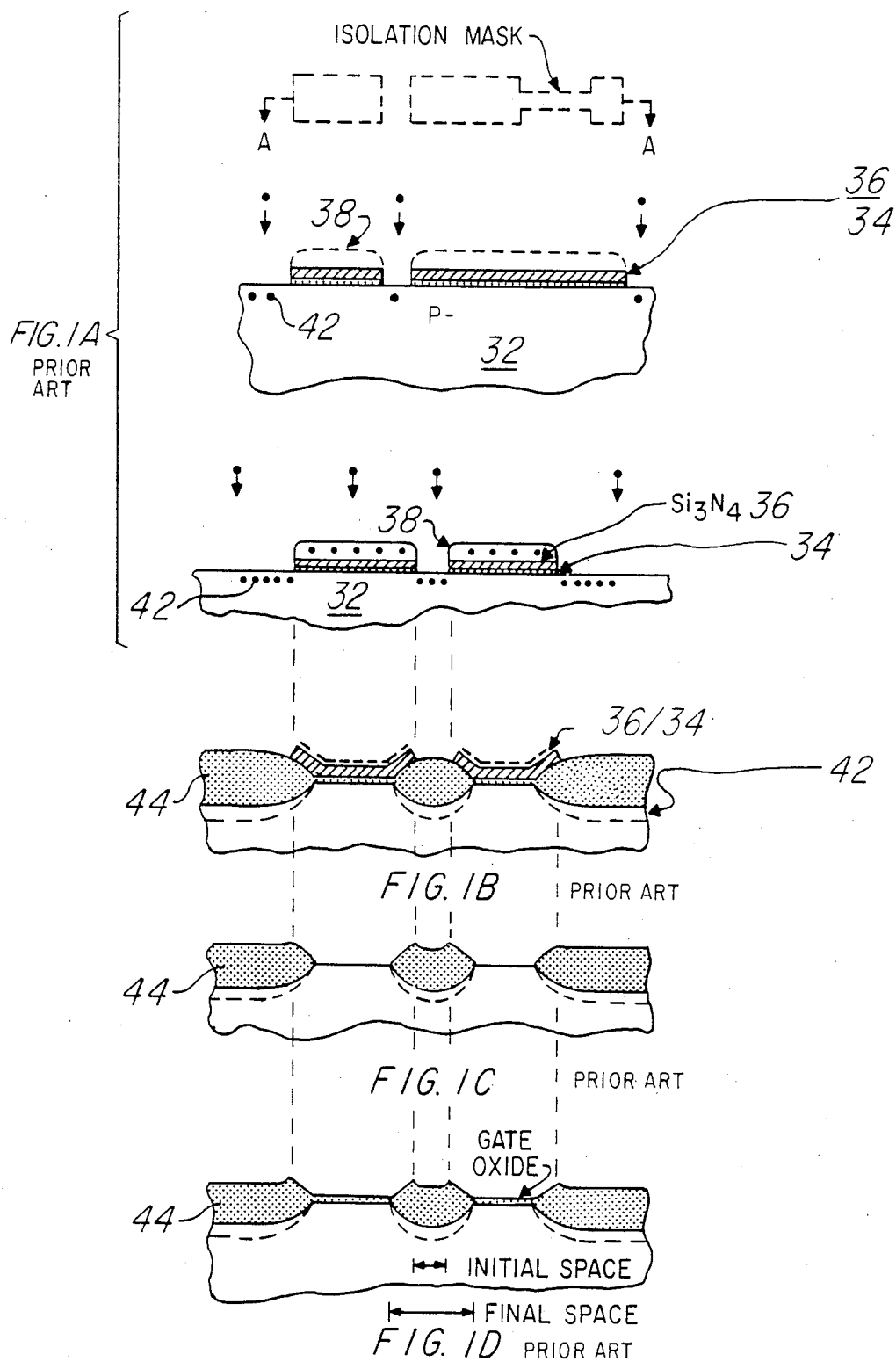
FIGS. 1A–D show standard LOCOS process steps in cross sectional elevation and plan views.

The embodiments are best described by first considering standard LOCOS isolation. FIGS. 1A–D illustrate in cross sectional elevation and plan views a typical NMOS LOCOS process which includes the following steps:

(a) Grow pad oxide 34 on silicon substrate 32, and deposit silicon nitride 36 on pad oxide 34. Spin on photoresist 38 and lithographically pattern it to define the field region (the complement of the moat or active area). Etch oxide 34/nitride 36 with patterned photoresist 38 as the etch mask, and implant channel-stop boron 42 using the same mask. The channel-stop implant is typically a dose of $1 \times 10^{12}/cm^2$ at 100 keV. See FIG. 1A.

(b) Strip patterned photoresist 38 and grow field oxide 44 with the patterned oxide 34/nitride 36 as an oxidation barrier. The implanted channel stop boron 42 diffuses laterally, and the field oxide 44 grows laterally under the patterned oxide 34/nitride 36 as shown in FIG. 1B.

(c) Strip the patterned oxide 34/nitride 36; see FIG. 1C. The field oxide isolation is now in place, and gate oxide is grown to begin fabrication of active devices in the moats; see FIG. 1D.

Figure 2:
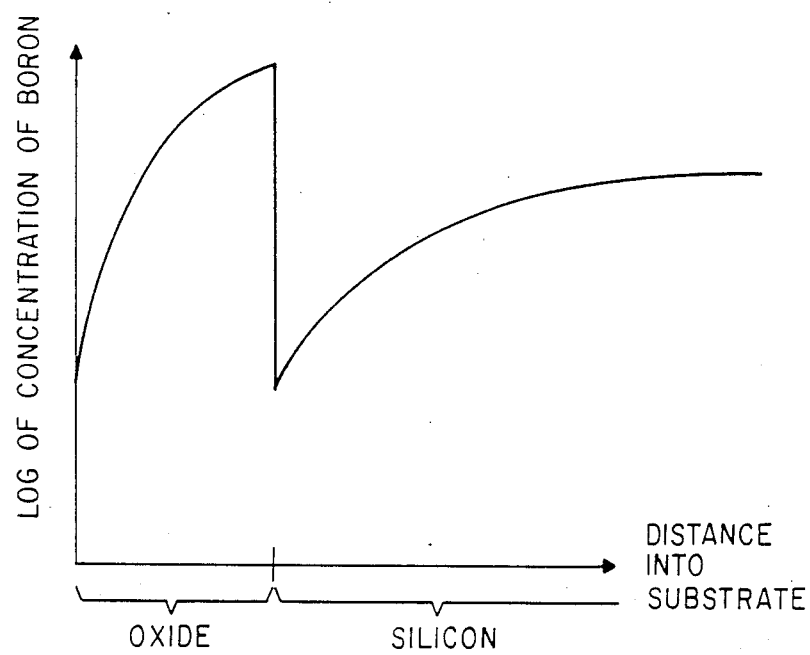
FIG. 2 illustrates segregation of boron into thermal oxide.

The standard process of FIGS. 1A–D has a problem of segregation of boron 42 into field oxide 44 during growth; the resulting doping profile under field oxide 44 is shown in FIG. 2. This low channel-stop boron doping level in silicon 32 at the interface with field oxide 44 implies low moat-to-moat punchthrough as the isolation dimensions are scaled down and low field oxide threshold voltages.

An apparent solution to the problem of the channel-stop boron segregation into the field oxide during growth is another channel-stop implantation after field oxide growth; this implantation is through the field oxide. FIG. 3A shows the SUPREM simulation results for field oxide threshold voltage (threshold for parasitic transistors between moats), $V_{TF}$. Plotted are $V_{TF}$ as a function of oxide thickness with and without boron through-field implant after oxidation. Implant energy and dose are 140 keV and $3 \times 10^{12}/cm^2$, respectively. Note that with through-field implant $V_{TF}$ is very sensitive to the oxide thickness. As shown in FIG. 3A, $V_{TF}$ can differ by more than 10 volts as oxide thickness varies 0.1 μm. Essentially, the points to the right of the peak of $V_{TF}$ correspond to the bulk of the boron not penetrating the field oxide and the points to the left of the peak correspond to the bulk of the boron being implanted deep in the silicon and away from the oxide/silicon interface. Further, the field oxide thickness depends upon the field oxide dimensions for regions smaller than about 2 μm in at least one direction; see FIG. 3B which shows field oxide thickness as a function of field region width for a 0.85 μm thick bulk field oxide for a modified version of LOCOS. This thickness dependence on field oxide width is probably due to the stresses caused by the nitride oxidation barrier on either edge of the field pattern. Considering FIGS. 3A and 3B, through-field channel-stop implantation does not appear reliable.

Figure 4:
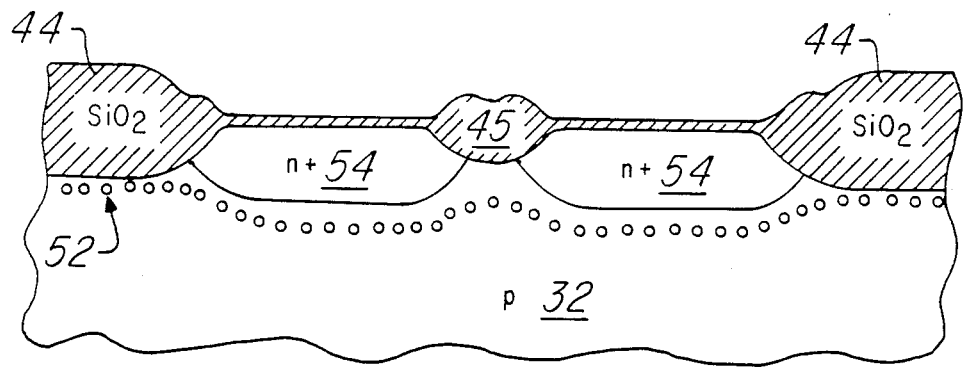
FIG. 4 illustrates through-field channel-stop implantation in LOCOS isolation.

Through-field channel-stop implantation also has another problem: if the implant is not masked, then the boron will also increase the p doping at the n+ junctions and under the channel and increase junction capacitance and lower breakdown voltage. FIG. 4 is a cross sectional elevation view corresponding to the view of FIG. 1 and schematically illustrating through-field implanted boron 52; the line 52 of small circles represents the peak of the boron concentration and is the cross section of the surface in three dimensions of peak boron concentration. In FIG. 4 a narrow field oxide region 45 is shown to illustrate the deeper penetration into silicon 32 if boron 52 need only traverse a thin portion of field oxide. The increased p doping below the n+ junctions 54 is also shown. With a thin field oxide of thickness 0.5 μm and a shallow junction of depth 0.3 μm, the boron 52 peak concentration beneath junctions 54 is only about 0.2 μm from junctions 54. However, to restrict the implantation to the field oxide and not also implant the moat, a masked implantation is needed with the mask pattern even smaller than the field oxide mask pattern (FIG. 1A) to accommodate alignment tolerances. Thus for feature sizes of 1 μm or less, the practicality of such masked through-field channel-stop implant vanishes due to the implantation mask requirements.

Figure 5:
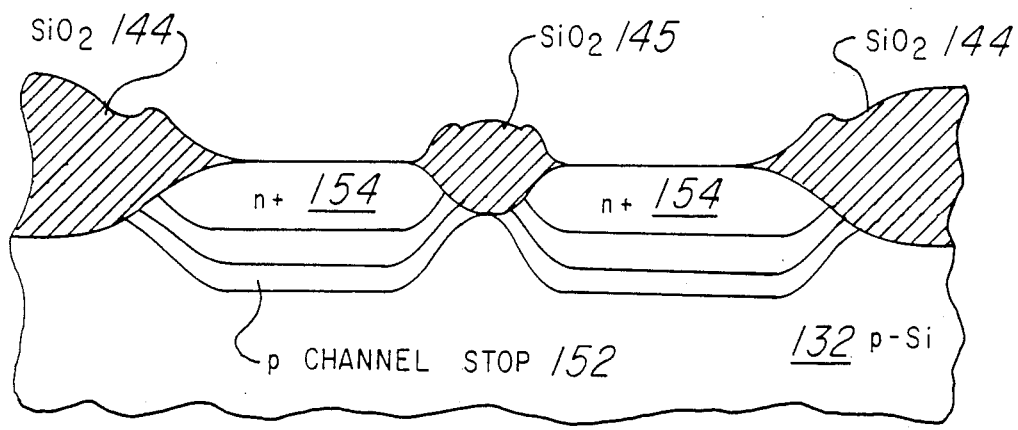
FIG. 5 illustrates the first preferred embodiment isolation.
Figure 6A:
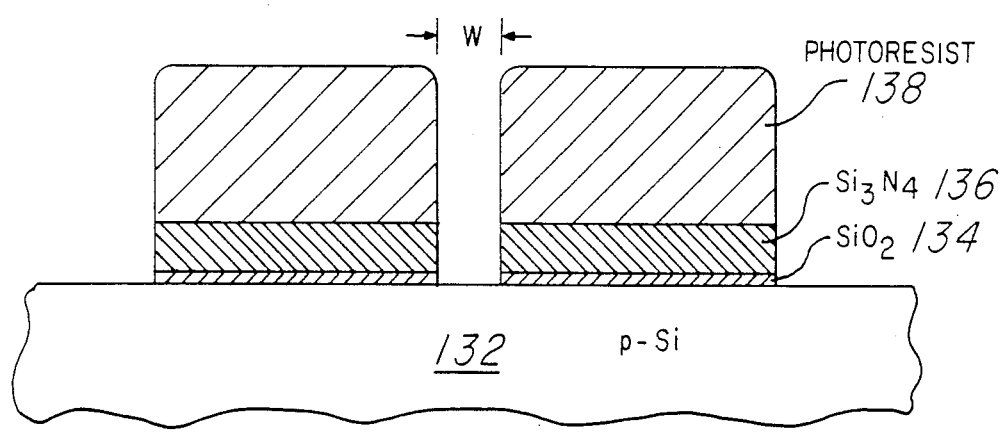
FIGS. 6A–E are cross sectional elevation and doping profile views of a first preferred embodiment method of fabrication of the first preferred embodiment isolation.
Figure 6B:
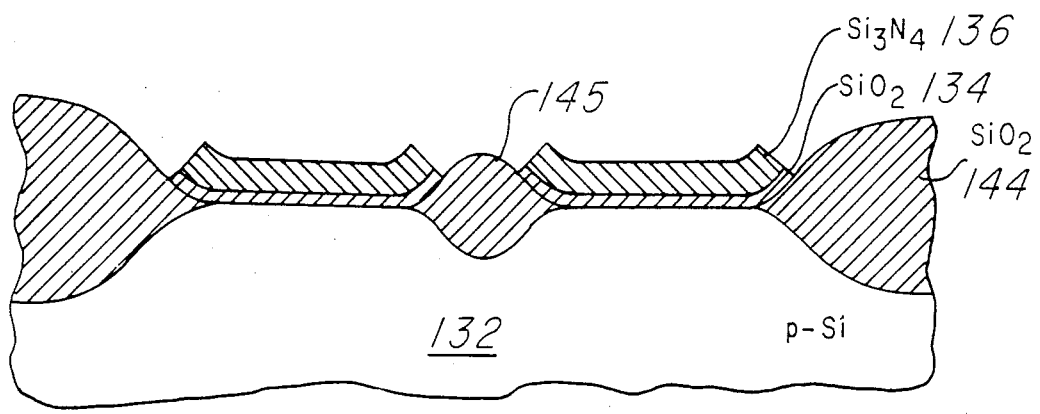
Figure 6C:
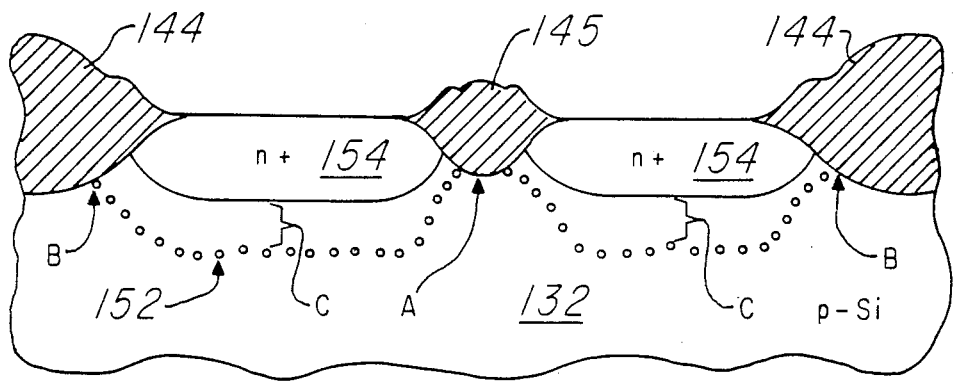

First preferred embodiment isolation structure is illustrated in cross sectional elevation view in FIG. 5, and steps in a first preferred embodiment method of fabrication of the first preferred embodiment isolation structures are illustrated in cross sectional elevation views in FIGS. 6A–C. The first preferred embodiment isolation structure is most clearly explained by initially considering the steps fo the first preferred embodiment method which include the following:

(a) Grow pad oxide 134 (about 350 Å) on silicon substrate 132, and deposit silicon nitride 136 (about 1,500 Å) on pad oxide 134. Spin on photoresist 138 and lithographically pattern it to define the field region (the complement of the active area or moat). Etch oxide 134/nitride 136 with patterned photoresist 138 as the etch mask. See FIG. 6A which also illustrates a field region of minimal width W=0.8 μm.

(b) Strip patterned photoresist 138 and grow field oxide 144 (about 7,000 Å bulk thickness which is the thickness at large field regions not influenced by adjacent patterned nitride/oxide induced stresses) in steam at 900° C. with the patterned oxide 134/nitride 136 as an oxidation barrier. The field oxide 144 grows laterally under the patterned oxide 134/nitride 136 as shown in FIG. 6B. The thickness of field oxide 145 (which grew in the field region of width W) is about 4,200 Å at the maximum. Field oxide 145 is the thinnest field oxide because it grew from a minimal-width field region, and thus has the lowest $V_{TFn}$ prior to channel-stop implantation.

Figure 7:
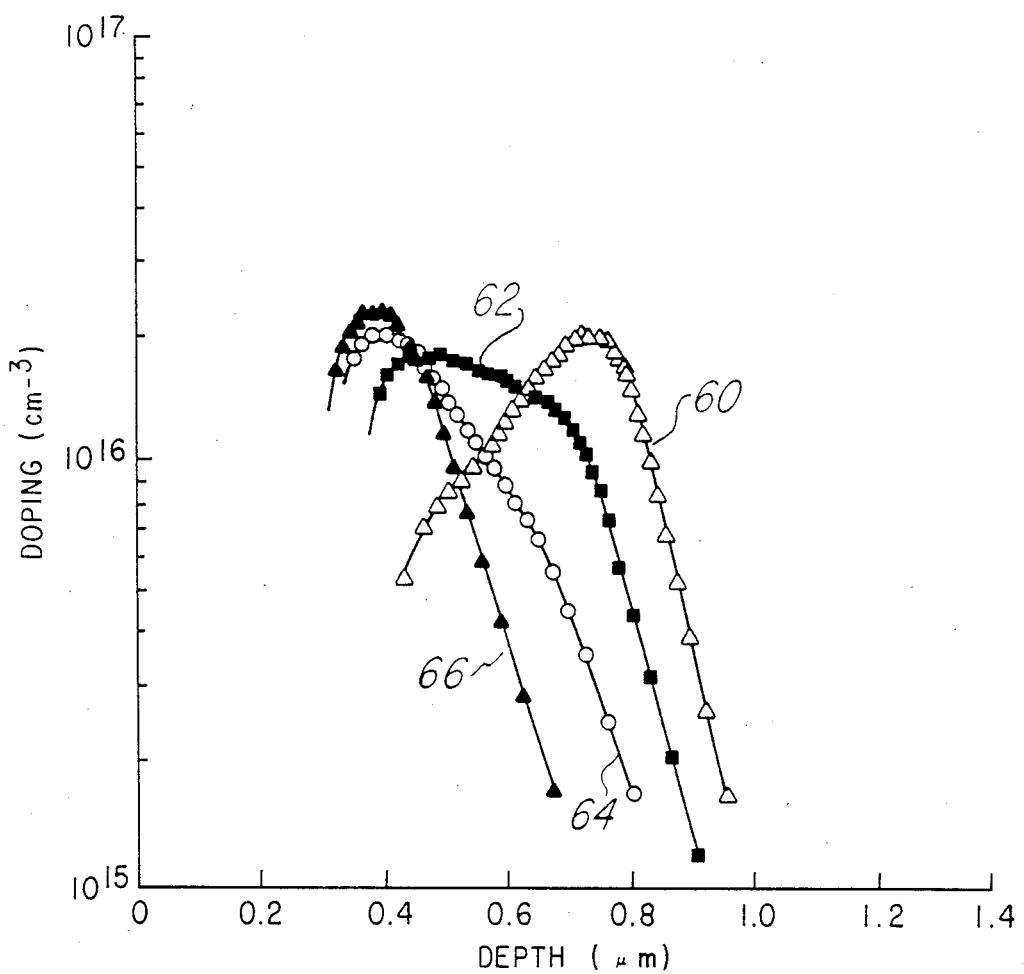
FIG. 7 shows boron channeling in <100> silicon.

(c) Strip the patterned oxide 134/nitride 136, and implant channel-stop boron 152 without any masking. Note that the stripping also removes about 500 Å of exposed field oxide 144. The channel-stop implant is a dose of $3\times 10^{12}/cm^2$ at 140 keV and with the ion beam aligned normal to the surface (oriented <100>); this energy gives a projected range in oxide of about 4,000 Å and this alignment provides maximum channeling and a projected range of about 8,000 Å in silicon 132. Note that the projected range for boron ions implanted into amorphous silicon is approximately the same as the projected range for boron ions implanted into thermal $SiO_2$ (for example, at 200 keV the projected range into silicon is about 0.5 μm and into oxide about 0.55 μm). Implantation into crystalline silicon is typically done with the ion beam aligned away from major-index axes to avoid channeling. For example, with <100> oriented silicon, a beam aligned about 7.4° from normal yields a projected range approximately the same as the projected range into amorphous silicon; whereas, a beam aligned parallel to the normal will channel and have a projected range close to twice the projected range into amorphous silicon. See FIG. 7 illustrating the channeling of boron implanted into <100> silicon at various alignments. FIG. 6C shows the effect of this implantation after n+ junction formation and should be compared with FIG. 4 illustrating the standard through-field channel-stop implantation; in both Figures the line of small circles represents the peak concentration of boron. Note that boron 152 is implanted at an energy which provides a projected range in oxide approximately equal to the maximum thickness of the thinnest field oxide 145; this insures maximal boron concentration at the oxide silicon interface for the thinnest field oxide as illustrated by "A" in FIG. 6C. This implantation energy also implies that the bulk of the boron 152 does not penetrate thick field oxide 144 except about the bird's beak as illustrated by "B" in FIG. 6C; however, this still provides sufficient isolation because (1) the thick field oxide 144 is necessarily wider than thin field oxide 145 and thus requires a much longer punchthrough or parasitic transistor channel, (2) the interface about "B" does provide a channel stop, and (3) a standard self-aligned channel-stop implantation prior to field oxidation will provide sufficient isolation for a wide field region. Also, the alignment to maximize channeling of the implant insures sufficient separation (indicated by "C" in FIG. 6C) between junction 154 and implant 152 to avoid increased junction-to-substrate capacitance and decreased junction-to-substrate breakdown.

Figure 6D:
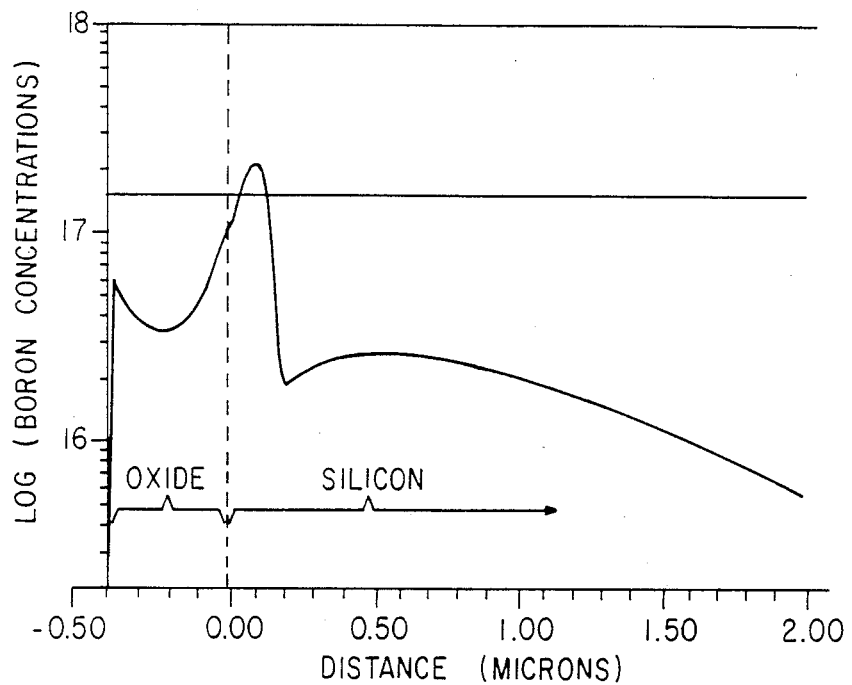
Figure 6E:
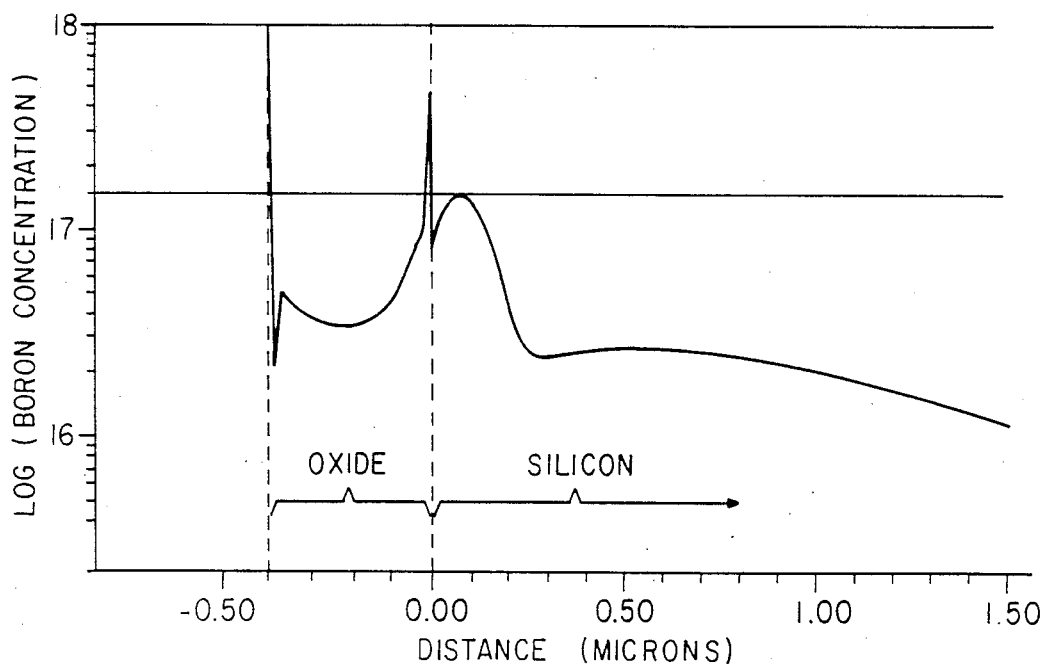

(d) With the isolation now in place, grow gate oxide and continue fabrication of active devices in the moats. Such further processing typically includes high temperature steps, and the implanted boron diffuses. FIGS. 6D–E show the boron doping profile under the field oxide just after the through-field implant (FIG. 6D) and after processing of the devices is completed (FIG. 6E); note that the distance is measured from the oxide/silicon interface in both Figures.

Second and third preferred embodiment isolation structures and fabrication methods are for CMOS devices and fabrication. The second preferred embodiment methods use a noncritical masking of the n well, so the p well is treated similarly to the NMOS structures and methods of the first preferred embodiments. The n well has only a standard self-aligned boron channel stop prior to field oxidation, but this is sufficient for the PMOS devices. Experimentally, with a bulk field oxide thickness of 7,000 Å, a through-field boron channel-stop implant of energy 180 keV and dose $2.5\times 10^{12}/cm^2$, field regions of minimum 0.8 μm width (4,800 Å maximum thickness) had $V_{TFn}$ greater than 10 volts, a moat-to-moat punchthrough of more than 8 volts (without the implant the punchthrough is less than 5 volts), no change in the active transistor threshold voltage, and a source/drain junction to substrate breakdown voltage of 18 volts (compared to 22 volts without the implant) which is still well above the minimum CMOS requirement of about 10 volts.

Figure 8A:
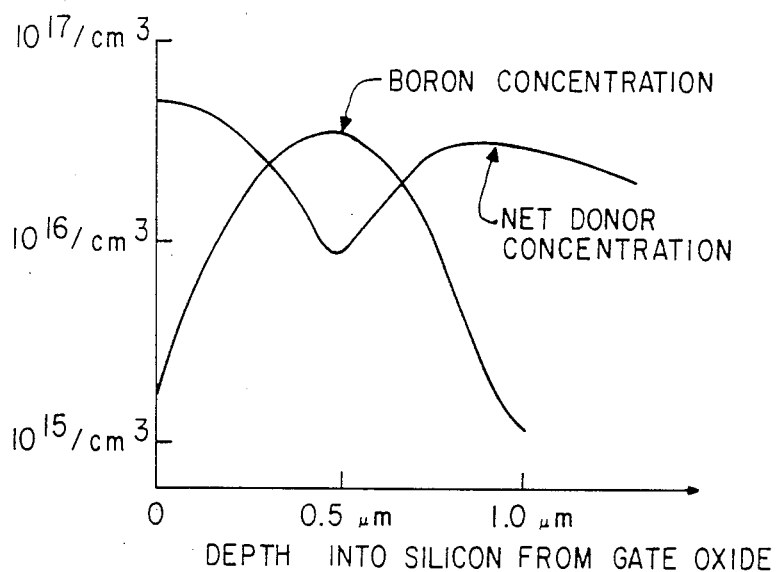
FIGS. 8A–B are doping profiles for the second preferred embodiments.
Figure 8B:
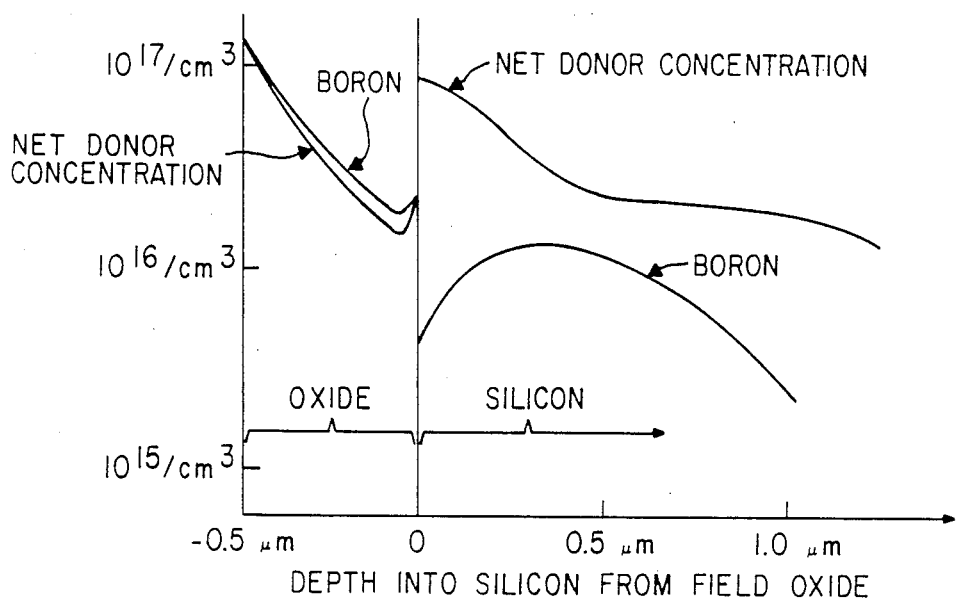

The third preferred embodiment isolation structures and method of fabrication are similar to the second preferred embodiments but without the noncritical masking of the n well during the through-field channel-stop implantation; thus the standard CMOS process can be used without any additional masks. The boron implanted into the n well counters the n dopant (typically phosphorus or arsenic), but the n doping may still be sufficient to preserve good p channel transistor characteristics. For example, with a field oxide thickness of 4,800 Å and a boron implant energy of 180 keV and dose of $1.5 \times 10^{12}/cm^2$ into an n well originally doped with phosphorus to $4 \times 10^{16}/cm^3$ at the silicon surface, the resultant simulated (without presuming channeling for the boron implant) doping profiles are shown in FIGS. 8A-B with FIG. 8A for the active device channel region under the gate oxide and FIG. 8B for under the field oxide (plus into the field oxide by negative distance). Note that in the channel region the net dopant concentration reduces to about $1 \times 10^{16}/cm^3$ at 0.5 μm below the silicon surface, but this is still adequate. The field threshold voltages $V_{TFp}$ and $V_{TFn}$ were both more than 10 volts in magnitude.

In all three embodiments the alignment of the implant can be disregarded if the junctions are sufficiently shallow compared to the thinnest portion of the field oxide (which determines the implant depth). That is, the field oxide thickness and the junction depth are somewhat independent parameters, so if the field oxide thickness (for small width regions) is approximately equal to the junction depth, then an aligned implant would be necessary to avoid the channel stop dopants being right next to the junction; whereas, if the field oxide thickness is much greater than the junction depth, then an aligned implant may not be necessary.

MODIFICATIONS AND ADVANTAGES

Various modifications of the preferred embodiment devices and methods may be made while retaining the features of through-field implantation of channel stop impurities with implantation depth determined by the thinnest regions of field oxide and alignment of the implant for maximum channeling to avoid substrate to junction capacitance and breakdown. For example, the dimensions, shapes, materials, and types of the devices and field oxides can be varied; non-LOCOS field oxides can be used; and silicon-on-insulator substrates can be used.

The through-field implant of channel stop impurities with depth determined by thin portions of field oxide and provides the advantage of maskless channel stop implant that is effective for both thick and thin portions of the field oxide.

What is claimed is:

1. A method of isolation fabrication of an integrated circuit having a surface with active regions, with at least some of said active regions containing NMOS transistors, said method comprising:
   a. growing a field oxide on regions of the surface, said field oxide having at least two different widths, with some of said widths being substantially greater than 1 micron, and with some of said widths being less than about 1 micron, with said growing of field oxide creating an oxide-silicon interface beneath said oxide; and
   b. implanting channel stop dopants in said integrated circuit without active area masking, said implanting being at an energy high enough to implant channel stop dopants through field oxide in regions having widths less than about 1 micron to provide a maximum of implanting channel stop dopants in silicon under said oxide-silicon interface, but with said implanting being at an energy low enough to provide a maximum of implanting channel stop dopants within said field oxide regions having widths substantially greater than 1 micron.

2. The method of claim 1, wherein:
   (a) said channel stop dopants are boron; and
   (b) said active device regions are moats to be doped n or p type for n and p channel field effect transistor active devices.

3. The method of claim 2, wherein:
   said implant of channel stop dopants is performed with the dopant ion beam aligned to provide maximal channeling of the dopant ions in the active device regions.

* * * * *